United States Patent [19]

Kawata et al.

[11] Patent Number: 5,445,677
[45] Date of Patent: Aug. 29, 1995

[54] APPARATUS FOR MANUFACTURING SEMICONDUCTOR AND METHOD OF MANUFACTURING SEMICONDUCTOR

[75] Inventors: Yoshinobu Kawata; Toshinobu Banjo, both of Fukuoka, Japan

[73] Assignee: Mitsubishi Denki Kabushiki Kaisha, Tokyo, Japan

[21] Appl. No.: 241,572

[22] Filed: May 12, 1994

[30] Foreign Application Priority Data

May 21, 1993 [JP] Japan .................. 5-120009

[51] Int. Cl.⁶ ............................................. C23C 16/00
[52] U.S. Cl. ................... 118/724; 118/725; 118/728; 118/730; 156/345
[58] Field of Search ............... 118/725, 728, 730, 724; 156/345

[56] References Cited

U.S. PATENT DOCUMENTS

| 5,238,499 | 8/1993 | van de Ven | 118/728 |
| 5,370,739 | 12/1994 | Foster | 118/725 |

FOREIGN PATENT DOCUMENTS

| 57-93141 | 11/1955 | Japan . |
| 62-188139 | 11/1987 | Japan . |
| 2-271612 | 11/1990 | Japan . |
| 2-283696 | 11/1990 | Japan . |
| 3-56129 | 5/1991 | Japan . |
| 3-134174 | 6/1991 | Japan . |
| 4-25015 | 1/1992 | Japan . |
| 4-75328 | 3/1992 | Japan . |

*Primary Examiner*—Richard Bueker
*Attorney, Agent, or Firm*—Oblon, Spivak, McClelland, Maier & Neustadt

[57] ABSTRACT

A treatment utilizing chemical vapor deposition is conducted on a major treatment surface (14) of a semiconductor substrate (8) under the condition where the semiconductor substrate (8) is held on a bottom surface of a stage (10) by suction force which is caused by reducing pressure in a vacuum pocket (13). In such a treatment, inert gas supplied by an inert gas feeder (24) is fed through a fluid duct (43) and inert gas feed holes (52) to an inert gas jetting gap (32) which is a space between an outermost circular surface (31) of an outer portion of a substrate holding surface (11) and a reverse major surface (12) of the semiconductor substrate (8). The inert gas is jetted out of the inert gas jetting gap (32) to a reaction chamber (6). Jets of the inert gas prevents undesirable objects or reaction byproduct (34) from easily penetrating in an inner region of the substrate holding surface (11). Thus, deposition of the reaction byproduct is prevented, and reduction of strength of holding the semiconductor substrate by suction force is avoided. As a result, operating efficiency of a semiconductor manufacturing apparatus and the yield are enhanced.

13 Claims, 17 Drawing Sheets

APPARATUS FOR MANUFACTURING SEMICONDUCTOR AND METHOD OF MANUFACTURING SEMICONDUCTOR

BACKGROUND OF THE INVENTION

1. Field of the Invention

The present invention relates to a semiconductor manufacturing technology in which predetermined treatment is performed to a semiconductor substrate, including a process of forming a layer of some specified composition on a surface of the semiconductor substrate by means of CVD (Chemical Vapor Deposition).

2. Description of the Prior Art

<Arrangement of Prior Art Semiconductor Manufacturing Apparatus>

FIG. 16 is a front sectional view showing a face-down type atmospheric pressure CVD apparatus of an exemplary semiconductor manufacturing apparatus in the prior art. A reaction container 1 has a reaction container body 2 and a disk-shaped turn table 3, and the turn table 3 is rotatably supposed by the reaction container body 2 through a rotation bearing 4, with its major surfaces retained horizontal. The turn table 3 is fixed at its center to a first end of a cylindrical vacuum conduit 5. Since a second end of the vacuum conduit 5 is fixed to a substrate holder 7, the substrate holder 7 is hung by the vacuum conduit 5 from the turn table 3 within a reaction chamber 5 in the reaction container 1. The turn table 3 is rotated by a driving mechanism not shown, and as it rotates, the substrate holder 7 is accordingly rotated. The substrate holder 7 has a stage 10 and a heater 9 which are fixed to each other on their respective junction planes. A vacuum pocket 13 is formed in a bottom surface of the stage 10 to hold a semiconductor substrate 8 in vacuum suction, and the bottom surface of the stage 10 works as a semiconductor substrate holding surface 11. The vacuum pocket 13 is brought to a vacuum by air exhaustion through the vacuum conduit 5 connected to a suction inlet of a vacuum pump 15, and the semiconductor substrate 8 is held on the substrate holding surface 11 by suction force, with its obverse major treatment surface faced down. Facing the major treatment surface, a reactive gas feed plate 16 is mounted, and reactive gas feed holes are formed in the reactive gas feed plate 16. On the opposite side of the reactive gas feed plate 16 to the reaction chamber 6, there is a reactive gas mixing chamber 19. The reactive gas mixing chamber 19 is provided with a reactive gas inlet hole 20 connected to a reactive gas feeder 21 through a supply conduit. The reaction container body 2 has an evacuation passage 18 conducting the reaction chamber 6 to the outside and an inert gas inlet hole 22 supplying inert gas such as nitrogen gas in an upper portion of the reaction container body 2 at a higher position than the stage 10 of the substrate holder 7. The inert gas inlet hole 22 is connected to an inert gas feeder 23 through a feed pipe.

<Operation of the Prior Art Semiconductor Manufacturing Apparatus>

Operation of the prior art apparatus will now be described. First, the semiconductor substrate 8 to be directed to treatment is conveyed from the outside to the reaction chamber 6 through a conveyance passage. Then, the vacuum pump 15 starts exhaustion so that the semiconductor substrate 8 is held on the substrate holding surface 11 by suction force. In such a state, reactive gases are supplied from the reactive gas feeder 21 through the reactive gas inlet hole 20 into the reactive gas mixing chamber 19. Reactive gas mixture 31 mixed in the reactive gas mixing chamber 19 passes through the reactive gas feed holes into the reaction chamber 6. Heat generated by the heater 9 is equalized by the stage 10 and conducted uniformly throughout the semiconductor substrate 8. The heat causes thermal reaction of the reactive gas mixture 31, and a film of a specific composition is formed on the major treatment surface of the semiconductor substrate 8. Exhausted gas containing the residual gas after the reaction is continuously evacuated from the reaction chamber 6 through the evacuation passage 18.

While the film is formed, the turn table 3 is rotated at a specified rotation speed. This allows the film to grow on the semiconductor substrate 8 uniformly throughout the major treatment surface. Also during formation of the film, inert gas such as nitrogen gas is supplied from the inert gas feeder 23 through the inert gas inlet hole 22 into the reaction chamber 6. The inert gas passes by the heater 9 and the semiconductor substrate 8 toward the evacuation passage 18. Flow of this inert gas inhibits reaction byproduct from attaching to side walls of the reaction container 1, substrate holder 7, etc.

When the film is formed in a specified thickness on the major treatment surface, the vacuum pump 15 is stopped and the semiconductor substrate 8 is released from the stage 10. After that, the semiconductor substrate 8 is conveyed through the conveyance passage out of the reaction chamber 6. The above mentioned procedure is repeated to conduct the similar treatment to many semiconductor substrates.

<Disadvantage of the Prior Art Apparatus>

In the prior art apparatus as mentioned above, although the inert gas works to let the reaction byproduct useless for the formation of the film go toward the evacuation passage 18 as previously mentioned, such byproduct cannot perfectly be removed; residual byproduct, floating around an outer surface of the stage 10, penetrates between the substrate holding surface 11 and the semiconductor substrate 8 because the vacuum pocket 13 is kept in lower pressure than the reaction chamber 6. FIG. 17 is an enlarged sectional view showing the circumferential side wall of the stage 10 and its vicinity, which schematically depicts how the residual byproduct penetrates. Because of the vacuum suction, the vacuum pocket 13 is kept lower in pressure than the reaction chamber 6. Pressure difference between them enable the reaction byproduct floating around the stage 10 to easily penetrate between the substrate holding surface 11 and the semiconductor substrate 8. Although the inert gas is useful to prevent the reaction byproduct from attaching to the circumferential side wall of the stage 10, the reaction byproduct deposited by continuous treatment to many semiconductor substrates also penetrates between the substrate holding surface 11 and the semiconductor substrate 8. Additionally, as exaggerated in FIG. 17, the semiconductor substrate 8 is, when heated, often distorted. Such thermal distortion results in a gap between the substrate holding surface 11 and a reverse major surface 12 of the semiconductor substrate 8. Thus, the thermal distortion would allow more reaction byproduct to penetrates in the gap.

As the treatment procedure is further repeated to new semiconductor substrates, the reaction byproduct penetrating in the gap is gradually accumulated on the substrate holding surface 11. As a result, cohesiveness of the substrate holding surface 11 with the semiconductor substrate 8 is deteriorated, and strength of holding the semiconductor substrate 8 declines. The reaction byproduct penetrating goes beyond the substrate holding surface 11 and is accumulated on an inner wall of the vacuum conduit 5. Consequently, the vacuum conduit 5 is clogged, and the holding strength to the semiconductor substrate 8 further declines.

As stated above, the prior art apparatus must be stopped at a certain frequency and be cleaned in order to prevent decline of the holding strength beyond a limit, and thus it has the disadvantage of bad operating efficiency. In addition to that, because of deterioration of the holding strength, the semiconductor substrate 8 held on the substrate holding surface 11 is released from it, dropped and destroyed, and thus, there is the disadvantage that the yield is reduced.

SUMMARY OF THE INVENTION

The present invention is directed to an apparatus for manufacturing semiconductor, in which a predetermined treatment is performed to a major treatment surface of a semiconductor substrate by feeding reactive gas. According to the present invention, the apparatus for manufacturing semiconductor comprises: (a) a reaction container for defining therein a reaction chamber which is capable of containing the semiconductor substrate, and further defining a reactive gas inlet hole which opens toward the reaction chamber to feed the reactive gas into the reaction chamber, an evacuation hole which opens toward the reaction chamber to evacuate gas used for reaction from the reaction chamber; (b) substrate holding means fixed in the reaction container, for defining a substrate holding surface to hold the semiconductor substrate within the reaction chamber by getting in contact with a reverse major surface of the major treatment surface of the semiconductor substrate, a pocket surrounded by the substrate holding surface to hold the semiconductor substrate by suction force, and also defining an inert gas jetting hole in a region surrounding the pocket to jet inert gas out; (c) reactive gas feeding means conducting to the reactive gas inlet hole, for feeding the reactive gas to the reactive gas inlet hole; (d) pressure reducing means conducting to the pocket, for reducing pressure in the pocket; and (e) inert gas feeding means conducting to the inert gas jetting hole, for feeding: the inert gas to the inert gas jetting hole.

In accordance with the present invention, the pressure in the pocket is reduced by the pressure reducing means, whereby the reverse major surface of the major treatment surface of the semiconductor substrate is drawn by suction force of the pocket. In a consequence, the semiconductor substrate is held by the substrate holding means. Then, the predetermined treatment with reactive gas which is fed into the reaction chamber from the reactive gas inlet hole by the reactive gas feeding means is conducted on the major treatment surface of the semiconductor substrate. In such a treatment, the inert gas is jetted out of the inert gas jetting hole provided in the region surrounding the pocket by the action of the inert gas feeding means. As a result, jets of the inert gas effectively prevents the undesirable objects from penetrating between the semiconductor substrate and the substrate holding surface. Consequently, penetration of the undesirable objects into the pocket and the pressure reducing means is also prevented.

Preferably, the inert gas jetting hole has a plurality of inert gas jetting holes.

Preferably, the reaction container includes (a-1) a reaction container body and (a-2) a turn table rotatably attached to the reaction container body, and the substrate holding means is fixedly coupled to the turn table so as to be rotatable together with the turn table in one united body.

Preferably, the substrate holding surface is perpendicular to a rotation axis of the turn table.

Preferably, the reaction container body includes (a-1-1) a reactive gas feed plate mounted facing the substrate holding surface, and the reactive gas inlet hole penetrates the reactive gas feed plate and opens toward the substrate holding surface.

Preferably, a level difference surface is formed in a region surrounding the pocket of the substrate holding means, being depressed from the substrate holding surface so that a portion of the substrate holding surface surrounding the pocket should be left, and the inert gas jetting hole is provided in the level difference surface.

There is a gap between the level difference surface depressed from the substrate holding surface in the substrate holding means and the semiconductor substrate being in contact with the substrate holding surface. The inert gas is pushed into the gap, and therefore, the entire region surrounding the pocket is uniformly filled with the flow of the inert gas.

Preferably, a groove surrounding the pocket is formed in the level difference surface, and the inert gas jetting hole is provided in the groove.

The inert gas is gushed into the groove formed in the level difference surface surrounding the pocket. Hence, the entire region surrounding the pocket is filled with the flow of the inert gas more uniformly.

Preferably, the apparatus for manufacturing semiconductor farther comprises (f) heating means fixedly coupled to the substrate holding means, for heating the substrate holding means, and the substrate holding means defines therein a first inert gas jetting passage for connecting the inert gas feeding means and the inert gas jetting hole.

The substrate holding means is heated by the heating means, and this causes the inert gas passing through the first inert gas jetting passage defined in the substrate holding means to be heated. In this way, temperature difference between the inert gas and the semiconductor substrate is kept small, and uniformity in heat throughout the semiconductor substrate can be enhanced.

Preferably, the reaction container includes: (a-1) a reaction container body; and (a-2) a turn table rotatably attached to the reaction container body, and the substrate holding means is fixedly coupled to the turn table so as to be rotatable together with the turn table in one united body.

Preferably, the substrate holding means and the heating means define respective contact faces and are in contact with each other on the contact faces, and a second inert gas jetting passage conducting to the first inert gas jetting passage for connecting the inert gas feeding means and the inert gas jetting hole is provided between the contact faces.

The second inert gas jetting passage is provided between the contact faces of the heating means and the substrate holding means. Thus, the inert gas passes through a heat conducting path between the heating means and the substrate holding means, and therefore, heating the inert gas can be further assuredly performed.

Preferably, the reaction container includes: (a-1) a reaction container body; and (a-2) a turn table rotatably attached to the reaction container body, the apparatus for manufacturing semiconductor further comprises: (g) a first conduit provided along the rotation axis of the turn table, for connecting the turn table and the heating means fixedly; and (h) a second conduit inserted into the first conduit so that the first and second conduits should be free from and coaxial with each other, and one end of the second conduit is fixedly joined to the substrate holding means and conducts to the pocket, and the other end conducts to the pressure reducing means, and the second inert gas jetting passage and the inert gas feeding means are connected by a clearance between the first conduit and the second conduit.

Preferably, the second inert gas jetting passage is a concave portion formed in a predetermined region of at least one of the respective contact faces.

Since the inert gas jetting passage between the contact faces is defined by the concave portion formed in the predetermined region of at least one of the contact faces of the substrate holding means and the heating means, processing the manufacturing apparatus is easy, and the path for the inert gas can be provided in a simple way.

Preferably, the second inert gas jetting passage is a groove formed in at least one of the respective contact faces.

The inert gas jetting passage between the contact faces is defined by the groove formed in at least one of the contact faces, processing the manufacturing apparatus is easy, and the path for the inert gas can be provided in a simple way.

Preferably, the apparatus for manufacturing semiconductor further comprises: seal means provided in a region surrounding the second inert gas jetting passage to retain airtight condition in the second inert gas jetting passage.

The seal means is provided around the inert gas jetting passage between the contact faces, and therefore, the inert gas is prevented from leaking in the reaction chamber.

Preferably, a circumferential side wall of the substrate holding surface is depressed inside a circumferential side wall of the semiconductor substrate.

Since the circumferential side wall of the substrate holding surface is terminated inside the circumferential side wall of the semiconductor substrate, no part of the substrate holding surface remain uncovered. In this way, contamination of the substrate holding surface by undesirable objects such as reaction byproduct is prevented more effectively.

The present invention is also directed to a method of manufacturing semicondutctor, in which a predetermined treatment is performed to a major treatment surface of a semiconductor substrate by feeding reactive gas. According to the present invention, the method of manufacturing semiconductor comprises the steps of: (a) defining a reaction chamber which is capable of containing the semiconductor substrate; (b) defining a substrate holding surface which is disposed within the reaction chamber and is capable of getting in contact with the semiconductor substrate, .a pocket surrounded by the substrate holding surface, and a hole in a region surrounding the pocket; (c) reducing pressure in the pocket to hold the semiconductor substrate in the reaction chamber while bringing a reverse major surface of the major treatment surface of the semiconductor substrate into contact with the substrate holding surface; (d) feeding the reactive gas into the reaction chamber while performing the step (c); (e) evacuating gas used for reaction from the reaction chamber while performing the step (c); and (f) jetting inert gas from the hole while performing the step (c).

Pressure in the pocket is reduced, and the reverse major surface of the major treatment surface of the semiconductor substrate is attracted toward the substrate holding surface by suction force, so that the semiconductor substrate is held by the substrate holding means. The predetermined treatment with the reactive gas is conducted on the major treatment surface of the semiconductor substrate. In such a treatment, the inert gas is jetted out of the inert gas jetting hole provided in the region surrounding the pocket. In this way, jets of the inert gas effectively prevents undesirable objects from penetrating between the reverse major surface of the major treatment surface and the substrate holding surface. Consequently, penetration of the undesirable objects in the pocket is also prevented.

Preferably, the step (f) includes (f-1) heating the inert gas before jetting it out of the hole.

The inert gas is heated before it is jetted out of the inert gas jetting hole. Hence, temperature difference between the inert gas and the semiconductor substrate is kept small, and uniformity in heat throughout the semiconductor substrate can be enhanced.

Preferably, the step (f-1) includes: (f-1-1) passing the inert gas through the substrate holding means; and (f-1-2) heating the substrate holding means, thereby to heat the inert gas.

The substrate holding means is heated, and this causes the inert gas passing through the substrate holding means to be heated. In other words, the semiconductor substrate and the inert gas can be heated not separately but at the same time.

Preferably, the step (d) includes (d-1) jetting the reactive gas toward the major treatment surface of the semiconductor substrate held by the substrate holding means.

Accordingly, it is an object of the present invention to provide a semiconductor manufacturing technology according to which undesirable substance such as reaction byproduct is prevented from penetrating in a substrate holding surface and a vacuum conduit to avoid reduction of suction force to a semiconductor substrate so that operating efficiency of an apparatus can be enhanced and that the yield can be enhanced.

These and other objects, features, aspects and advantages of the present invention will become more fully apparent from the following detailed description of the present invention when taken in conjunction with the accompanying drawings where like reference numerals denote corresponding parts.

DESCRIPTION OF THE PREFERRED EMBODIMENT

<1. The First Preferred Embodiment>

Figure 1:
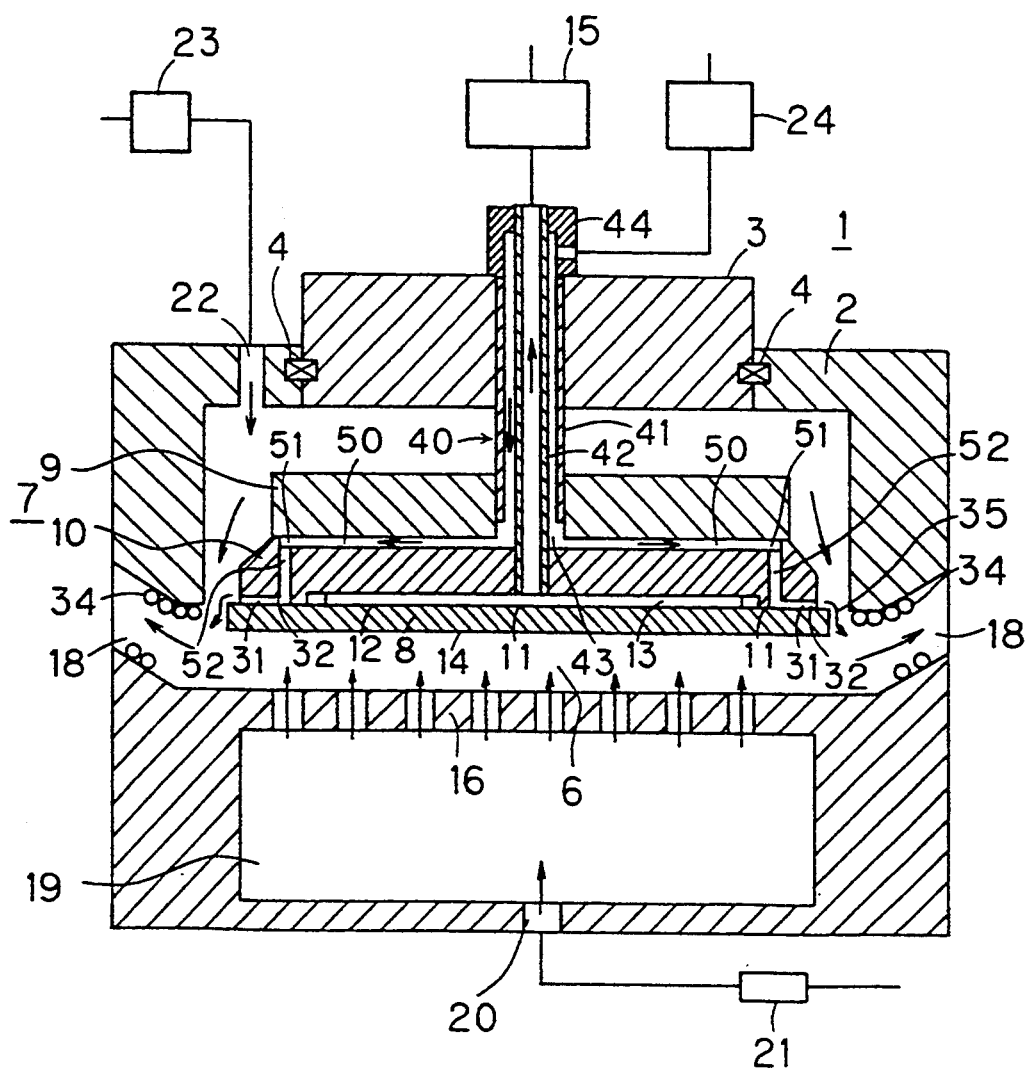
FIG. 1 is a front sectional view showing a semiconductor manufacturing apparatus of a first preferred embodiment of the present invention.

FIG. 1 is a front sectional view showing a semiconductor manufacturing apparatus of a first preferred embodiment of the present invention, namely, a face-down type atmospheric pressure CVD apparatus.

A reaction container 1 has a reaction container body 2 and a disk-shaped turn table 3, and the turn table 3 is rotatably supported by the reaction container body 2 through a rotation bearing 4, with its major surfaces retained horizontal. The turn table 3 has an aperture at its center, and a first end of an outer conduit 41 of a tubular dual conduit 40 is fitted in and fixed to the aperture. The first end of the outer conduit 41 and a first end of an inner conduit 42 of the dual conduit 40 corresponding in position to the first end of the outer conduit 41 extend through a bearing 44 in which both the first ends are slidable fitted, and the first end of the inner conduit 42 is connected to a vacuum pump 15 through a vacuum conduit while a fluid conduit 43 defined between the outer conduit 41 and the inner conduit 42 is connected to an inert gas feeder 24 through a pipe.

A second end of the outer conduit 41 of the dual conduit 40 is fitted in and fixed to an aperture extending through the center of a disk-shaped heater 9 constituting a substrate holder 7. A second end of the inner conduit 42 of the dual conduit 40 is fitted in and fixed to an aperture extending through the center of a disk-shaped stage 10. The heater 9 is fixed in its bottom surface to the stage 10 by bolts to cooperatively work as the substrate holder 7. Thus, the substrate holder 7 is hung from the turn table 3 on the dual conduit 40 within a reaction chamber 6 in the reaction container 1. As the turn table 3 is rotated by a driving mechanism not shown, the substrate holder 7 is accordingly rotated, and a vacuum passage and an inert gas passage are formed through the dual conduit 40 and the bearing 44.

An upper surface of the stage 10 coming in contact with the bottom surface of the heater 9 is provided with radial groove passages 50 conducting to the fluid duct 43 and a circular groove passage 51 intersecting the radial groove passages 50. A bottom surface of the stage 10 is provided with a vacuum pocket 13 to hold a semiconductor substrate 8 by suction force, and the bottom surface of the stage 10 surrounding a vacuum pocket 13 works as a substrate holding surface 11. The vacuum pocket 13 is exhausted to a vacuum by air exhaustion through the inner conduit 42 connected to a suction inlet of the vacuum pump 15, and the semiconductor substrate 8 is held on the substrate holding surface 11 by suction force, with its major treatment surface 14 faced down.

An outermost circular surface 31 in the bottom surface of the stage 10, positioned outside the vacuum pocket 13, is slightly depressed from the level of the semiconductor substrate holding surface 11. The outermost circular surface 31 is provided with vertical holes which extend along the circumference through the stage 10 in its axial direction, and the vertical holes lead to the circular groove passage 51 in the upper surface of the stage 10 to work as inert gas feed holes 52. When the semiconductor substrate 8 is held on the substrate holding surface 11 by suction force, an annular inert gas jetting gap 32 is defined in a minute width between a circumferential portion of the major treatment surface 12 of the semiconductor substrate 8 and the outermost circular surface 31 in the bottom surface of the stage 10. Inert gas fed through the dual conduit 40 and the inert gas inlet holes 52 is jetted out of the inert gas jetting gap 32 into the reaction chamber 6.

A reactive gas feed plate 16 is mounted, facing the major treatment surface 14 of the semiconductor substrate 8 held on the stage 10 by suction force, and reactive gas feed holes are formed in the reactive gas feed plate 16. On the opposite side of the reactive gas feed plate 16 to the reaction chamber 6, there is a reactive gas mixing chamber 19. In the reactive gas mixing chamber 19, a reactive gas inlet hole 20 connected to a reactive gas feeder 21 through a feed pipe is formed. The reaction container body 2 has an evacuation passage 18 conducting the reaction chamber 6 to the outside, and an inert gas inlet hole 22 for feeding inert gas such as nitrogen gas in an upper portion of the reaction container body 2 at a higher position than the stage 10 of the substrate holder 7. The inert gas inlet hole 22 is connected to a inert gas feeder 23 through the inert gas inlet hole 22.

Figure 2:
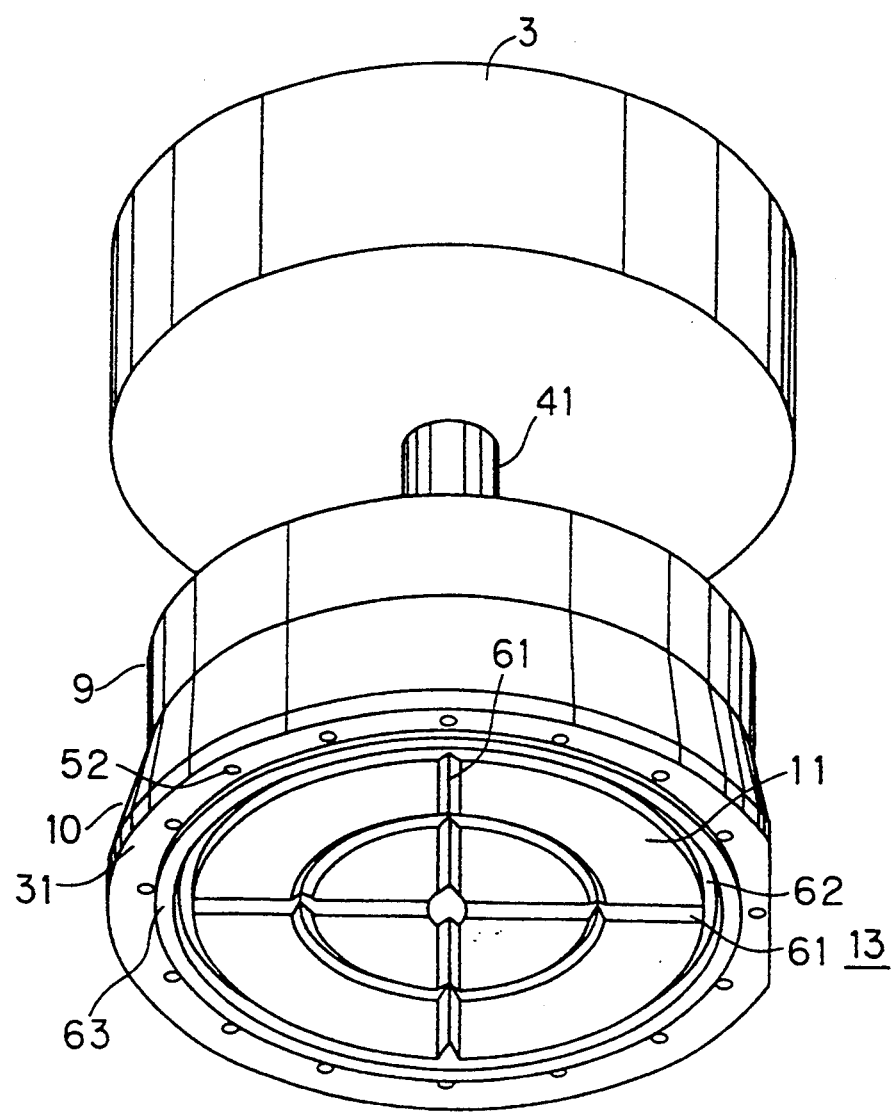
FIG. 2 is a partial perspective view illustrating the apparatus with a stage, seen from a lower level at an angle.

FIG. 2 is a perspective view illustrating a rotating part of this apparatus, seen from a lower position than the stage 10 at an angle. In the bottom surface of the stage 10, there is the vacuum pocket 13 comprised of radial ducts 61 and concentric circular ducts perpendicular to the radial ducts 61. There is an outermost annular portion 63 of the substrate holding surface 11 outside an outermost circular groove 62 defining the vacuum pocket 13. The above-mentioned outermost circular surface 31 in the bottom surface of the stage 10 is outside the outermost annular portion 63, and preferably, the outermost circular surface 31 is depressed approximately 5~50 μm from the outermost annular portion 63 of the substrate holding surface 11. The inert gas feed holes 52 formed in the outermost circular surface 31 in the bottom surface of the stage 10 is preferably provided close to the outermost annular portion 63 of the substrate holding surface 11.

Figure 3:
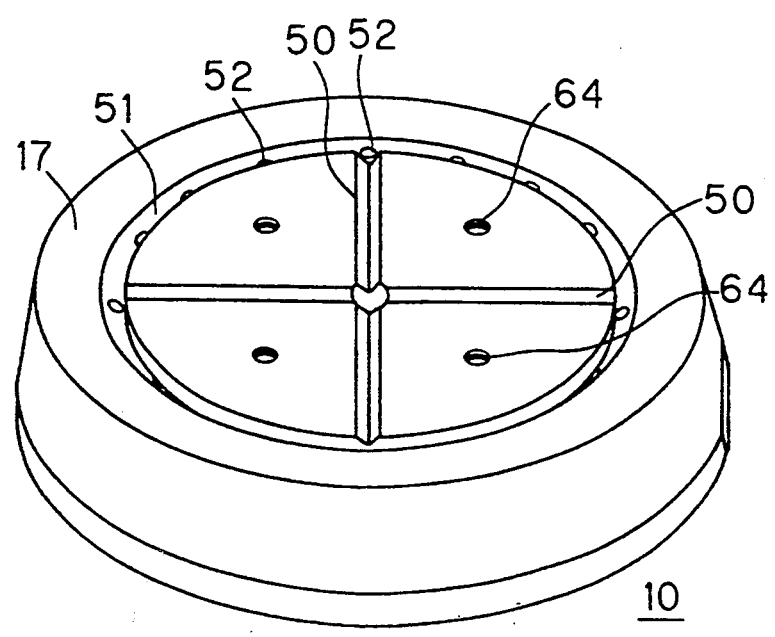
FIG. 3 is a perspective view illustrating the stage, seen from an upper level at an angle.

FIG. 3 is a perspective view showing the stage 10, seen from an upper position at an angle. There may be a plurality of concentric circular grooves instead of the single circular groove passage 51. Holes formed at intervals in the circular groove passage 51 are the inert gas inlet holes 52 circularly disposed in the outermost circular surface 31 at the bottom surface of the stage 10. Depths of the radial groove passages 50 and the circular groove passage 51 in the upper surface of the stage 10 are preferably in a range of about 0.5~1.0 mm. Blind screw holes 64 are formed in the upper surface of the stage 10 apart from the radial groove passages 50 and the circular groove passage 51, and the stage 10 and the heater 9 are fixed to each other by bolts screwed into the blind screw holes 64.

Figure 4:
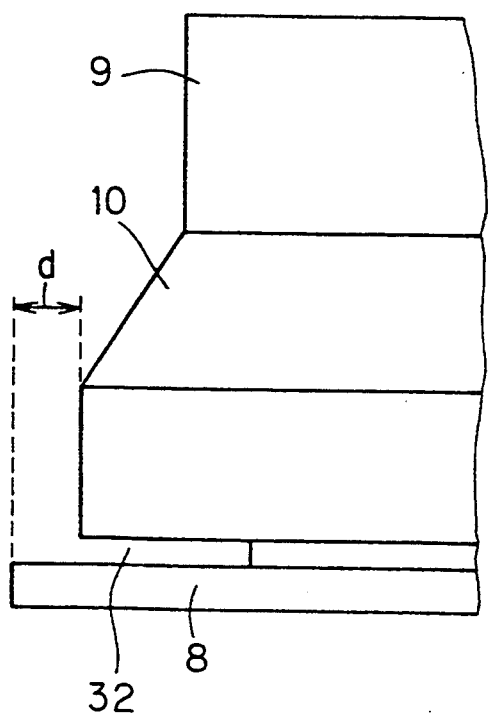
FIG. 4 is a sectional view illustrating a circumferential side wall of the stage and its vicinity.

FIG. 4 is an enlarged view showing the inert gas jetting gap 32 defined by the stage 10 and the semiconductor substrate 8. A circumferential side wall of the stage 10 is terminated somewhat inside a circumferential side wall of the semiconductor substrate 8. A difference "d" between terminating positions of both the circumferential side walls is preferably about 0.5 mm.

Referring to FIG. 1 again, an operation of the manufacturing apparatus will be described. The semiconductor substrate 8 is conveyed from the outside of the apparatus through a conveyance passage not shown into the reaction chamber 6. The vacuum pump 15 starts and the semiconductor substrate 8 is held on the substrate holding surface 11 by suction force. Then, the inert gas feeder 24 works and inert gas is jetted out of the inert gas jetting gap 32 toward the reaction chamber 6. Also, the inert gas feeder 23 operates and the inert gas is fed through the inert gas inlet hole 22 into the reaction chamber 6.

In such a state, reactive gases including silane gas ($SiH_4$), oxygen gas ($O_2$), and the like are fed from the reactive gas feeder 21 through the reactive gas inlet hole 20 into the reactive gas mixing chamber 19. In the reactive gas mixing chamber 19, these kinds of reactive gases are mixed. The resultant reactive gas mixture is blown through the reactive gas inlet holes in the reactive gas feed plate 16 into the reaction chamber 6. Heat generated by the heater 9, equalized by the stage 10, is conducted uniformly throughout the semiconductor substrate 8. The heat causes thermochemical reaction such as oxidation of the reactive gas mixture, and reaction byproduct, silicon dioxide ($SiO_2$) is deposited on the major treatment surface 14, and eventually film is formed thereon.

While the film is formed, the turn table is rotated at speed of 1~2 rpm. This enables the film to grow uniformly throughout the major treatment surface 14. The inert gas fed through the inert gas inlet hole 22 into the reaction chamber 6 goes by the heater 9 and then by the semiconductor substrate 8 toward the evacuation passage 18. Exhausted gas including the residual reactive gas and the reaction byproduct having no concern in film formation is continuously evacuated through the evacuation passage 18 out of the reaction chamber 6.

Upon the formation of the film in a specified thickness on the major treatment surface, the vacuum pump 15 is stopped, and the semiconductor substrate 8 is released from the stage 10 and then conveyed through the conveyance passage not shown out of the reaction chamber 6. The procedure as stated above is repeated in conducting similar treatment to many semiconductor substrates. Simply with the inert gas fed from the inert gas inlet hole 22 to the reaction chamber 6, however, the reaction byproduct are not fully evacuated and still resides, floating around the stage 10.

Figure 5:
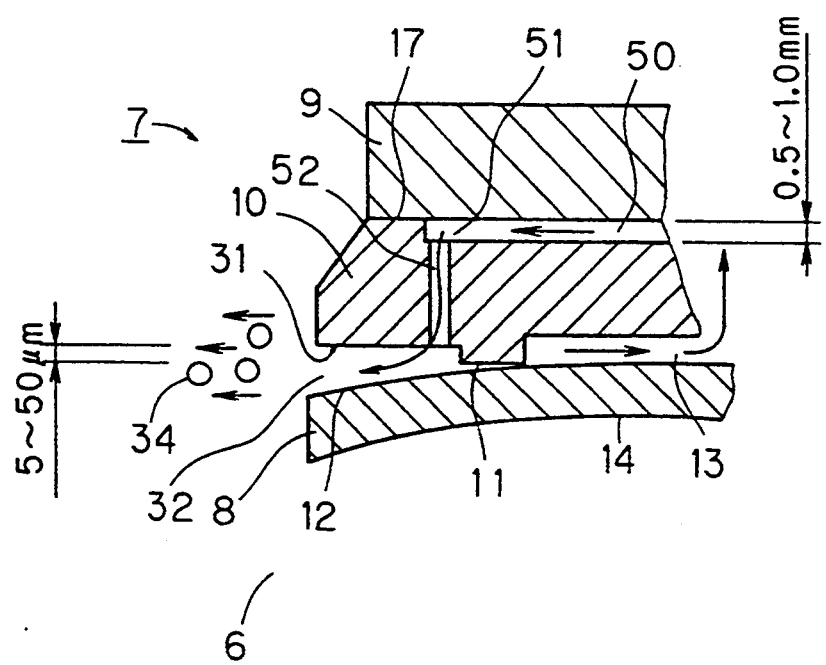
FIG. 5 is an enlarged side view illustrating the circumferential side wall of the stage.

FIG. 5 is an enlarged front sectional view showing the circumferential side wall of the substrate holder 7 and its vicinity. While the predetermined process is conducted on the major treatment surface 14 of the semiconductor substrate 8, the inert gas fed from the inert gas feeder 24 is passed through the inert gas feed hole 52 and is jetted through the inert gas jetting gap 32 toward the reaction chamber 6. Hence, the inert gas jetted out prevents the reaction byproduct 34 floating around the stage 10 from penetrating between the bottom surface of the stage 10 and the semiconductor substrate 8. If the reaction byproduct is attached even gradually to the circumferential side wall of the stage 10 as the film formation process is successively conducted on many semiconductor substrates like the semiconductor substrate 8, the reaction byproduct accumulated on the circumferential side wall of the stage 10 no longer penetrate between the bottom surface of the stage 10 and the semiconductor substrate 8. Thus, because of thermal distortion, the semiconductor substrate is transformed, and the reaction byproduct 34 is hardly accumulated on the substrate holding surface 11 even if the vacuum pocket is under lower pressure than the reaction chamber. Also, the reaction byproduct 34 never penetrate from the vacuum pocket 13 into a vacuum system including the inner conduit 42 and the like. As a result, strength of holding the semiconductor substrate 8 is hardly degraded even after treatment of many semiconductor substrates.

Since the circumferential side wall of the stage 10, as previously mentioned, is terminated slightly inside the circumferential side wall of the semiconductor substrate 8, it can be ensured that no part of the bottom surface of the stage 10 remains uncovered by the semiconductor substrate 8. Due to complete coverage as well as the very effect of the inert gas jetted out of the inert gas jetting gap 32, no part of the bottom surface of the stage 10 is contaminated by the reaction byproduct 34.

Additionally, in the semiconductor manufacturing apparatus of this preferred embodiment, since a path of the inert gas is formed within the substrate holder 7, the inert gas is heated, while passing through the substrate holder 7, and is equalized in temperature to the substrate holder 7. Thus, when the inert gas is jetted out of the inert gas jetting gap 32, there is no conspicuous temperature difference between the inert gas and the semiconductor substrate 8. Thus, there is the advantage that there is little temperature dispersion throughout the semiconductor substrate 8, that is, the advantage of enhanced uniformity in heat.

Also, in the semiconductor manufacturing apparatus of this preferred embodiment, a path conducting the inert gas from the inside of the substrate holder 7 through the dual conduit 40 to the outermost circular surface at the bottom surface of the stage 10 is implemented by the radial groove passages 50 and the circular groove passage 51 provided in the upper surface of the stage 10. Thus, there is the advantage that the path for the inert gas can be easily formed within the substrate holder 7. Moreover, since, due to the radial groove passages 50, the inert gas is fed in radial directions from their center to a circular arrangement of the inert gas feed holes 52, the inert gas equally reaches every one of the inert gas feed holes 52. Hence, uniformity in the quantity of the inert gas jetted out of the inert gas jetting gap 32 along the circumference of the stage 10 is enhanced.

Furthermore, since the outermost circular surface 31 is somewhat depressed from the substrate holding surface 11 so as to provide a level difference along the circumference of the bottom surface of the stage 10, it is ensured that a gap in a specified width can be formed in the entire circumference between the bottom surface of the stage 10 and the major treatment surface 12 of the semiconductor substrate 8. In other words, an outlet hole of which the inert gas is jetted out assuredly extends along the entire circumference of the substrate holder 7 in a specified width. Hence, the uniformity in the quantity of the inert gas jetted out over the entire circumference of the stage 10 is further improved.

In the upper surface of the stage 10 along its circumference, also a contact face 17 coming in contact with the bottom surface of the heater 9 is formed. The inert gas passing through the radial groove passages 50 and the circular groove passage 51 are prevented by the contact face 17 and the bottom surface of the heater 9 in contact with each other from leaking into the reaction chamber 6.

A cut-away portion usually named "orientation flat" is formed in part of a circumferential side wall of the semiconductor substrate 8. As shown in FIGS. 2 and 3, there is provided a cut-away flat face in part of the circumferential side wall of the stage 10 because corresponding part of the bottom surface of the stage 10 should be prevented from being exposed, uncovered with the semiconductor substrate 8 due to its orientation flat.

<2. The Second Preferred Embodiment>

Figure 6:
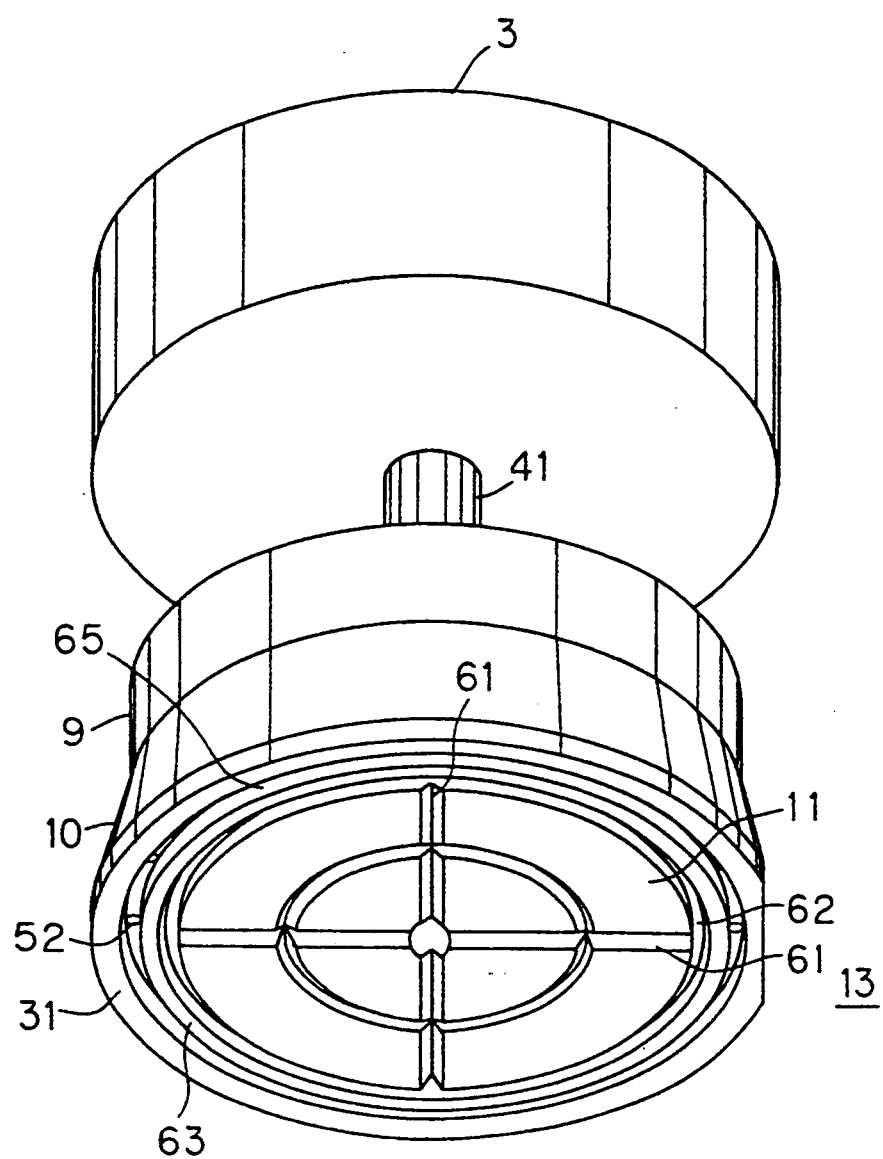
FIG. 6 is a partial perspective view illustrating an apparatus with a stage of a second preferred embodiment of the present invention.

FIG. 6 is a perspective view showing a rotating portion of a manufacturing apparatus of a second preferred embodiment, seen from a lower position at an angle. In this preferred embodiment, a circular groove 65 is formed along the entire circumference of an outermost circular surface 31 somewhat depressed from a substrate holding surface 11 with which a semiconductor substrate 8 is to come in contact. The circular groove 65 is positioned closest to an outermost annular portion 63 and farthest from the outer circumference of the outermost circular surface 31. In a bottom surface of the circular groove 65, inert gas feed holes 52 are provided.

Figure 7:
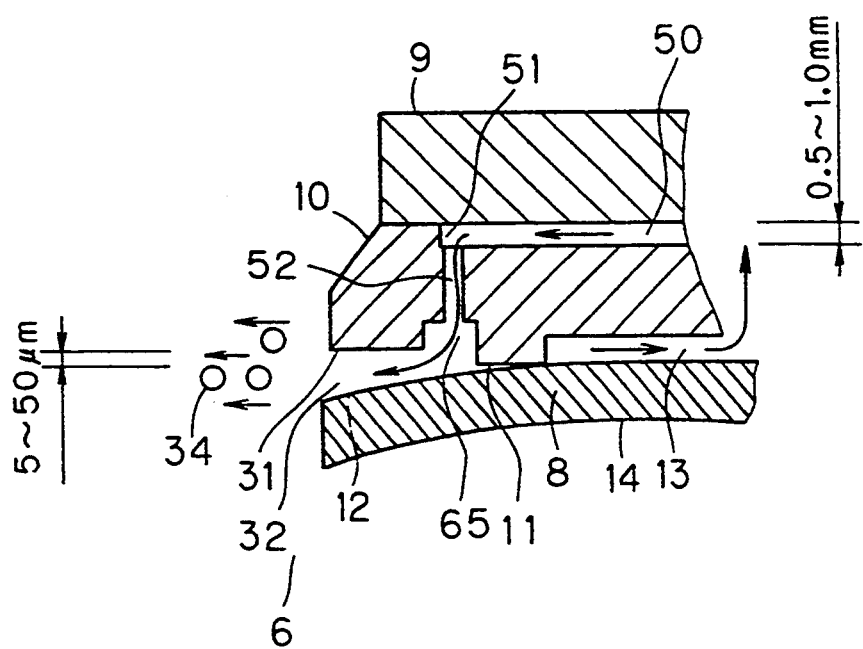
FIG. 7 is a sectional view illustrating a circumferential side wall of the stage and its vicinity.

FIG. 7 is a sectional view showing a circumferential side wall of a substrate holder 7 and its vicinity. Inert gas passing through the inert gas feed holes 52 is first spouted into the circular groove 65, and thereafter, it is gushed out of the circular groove 65 into an inert gas jetting gap 32. Moreover, the inert gas filling the inert gas jetting gap 32 is jetted into a reaction chamber 6. Since, in the semiconductor manufacturing apparatus of this preferred embodiment, a portion serving as a kind of reservoir of the inert gas going toward the inert gas jetting gap 32 continuously extends along the entire circumference, the quantity of the inert gas gushed to the inert gas jetting gap 32 is kept more uniform along the entire circumference of the substrate holder, compared with the semiconductor manufacturing apparatus of the first preferred embodiment. In consequence, uniformity in the quantity of the inert gas jetted out of the inert gas jetting gap 32 along the entire circumference into the reaction chamber 6 is further enhanced.

<3. The Third Preferred Embodiment>

Figure 8:
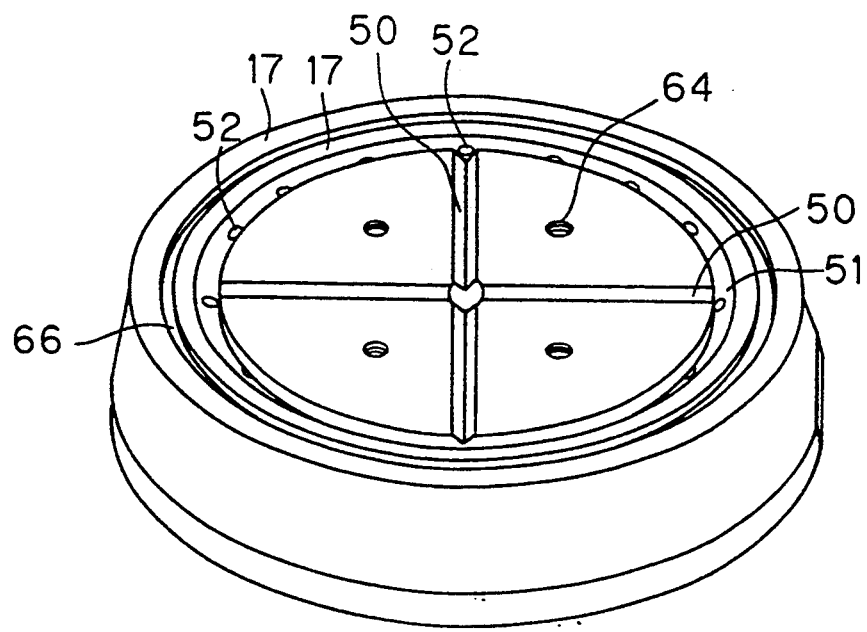
FIG. 8 is a perspective view showing a stage according to a third preferred embodiment of the present invention.

FIG. 8 is a perspective view showing a stage 10 of a manufacturing apparatus of a third preferred embodiment, seen from an upper position at an angle. A circular groove 66 is formed along the entire circumference of a contact face 17 coming in contact with a bottom surface of a heater 9.

Figure 9:
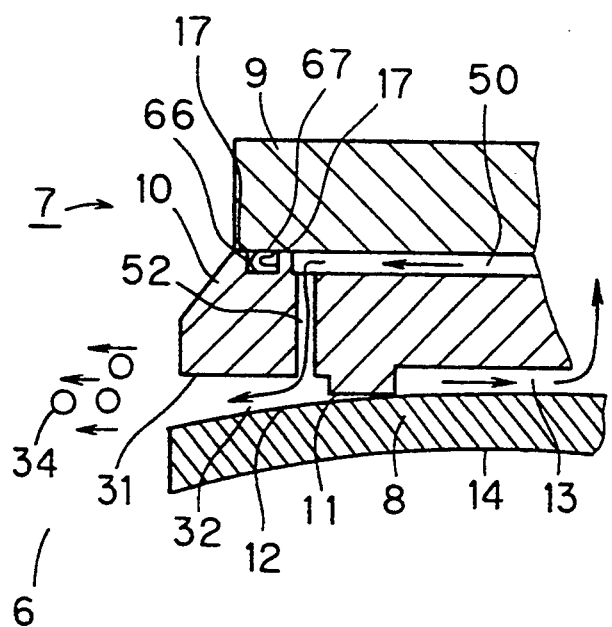
FIG. 9 is a sectional view illustrating a circumferential side wall of the stage and its vicinity.

FIG. 9 is an enlarged front sectional view showing a circumferential side wall of a substrate holder 7 and its vicinity. A ring-shaped metal seal 67 is buried in the circular groove 66. Due to the seal 67, this preferred embodiment, compared with the semiconductor manufacturing apparatuses of the preferred embodiments previously mentioned, has the advantage that inert gas passing through radial groove passages 50 and a circular groove passage 51 hardly leak along the contact face 17 into a reaction chamber 6.

<4. The Fourth Preferred Embodiment>

Figure 10:
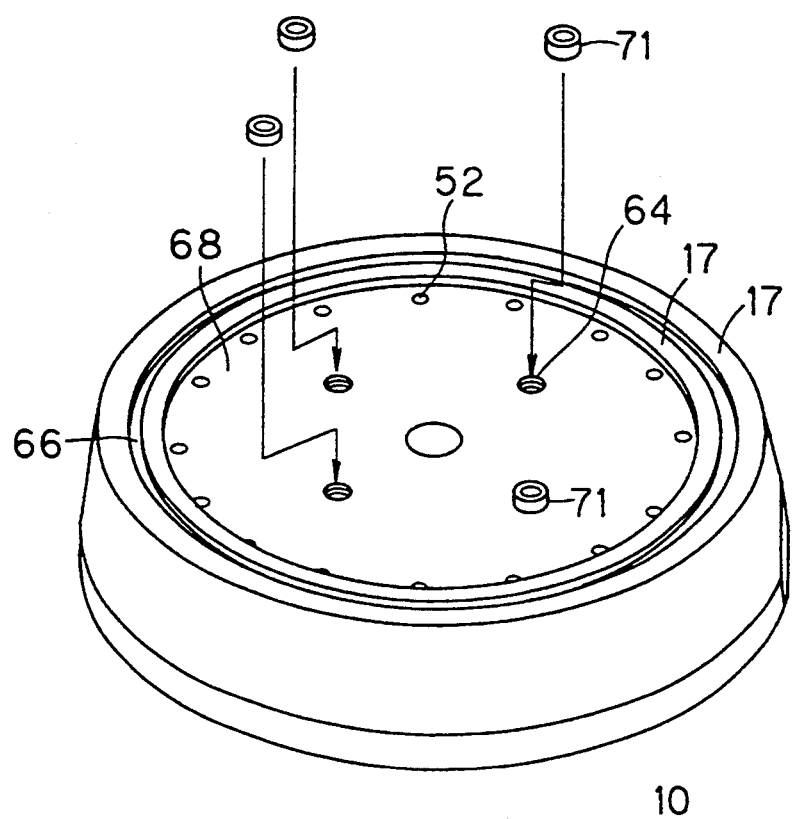
FIG. 10 is a perspective view showing a stage according to a fourth preferred embodiment of the present invention.

FIG. 10 is a perspective view showing a stage 10 of a semiconductor manufacturing apparatus of a fourth preferred embodiment, seen from an upper position all an angle. An upper surface of the stage 10 has a concave plane 68 in its center portion, which is depressed from and surrounded by a contact face 17 extending along the circumference of the stage 10.

Figure 11:
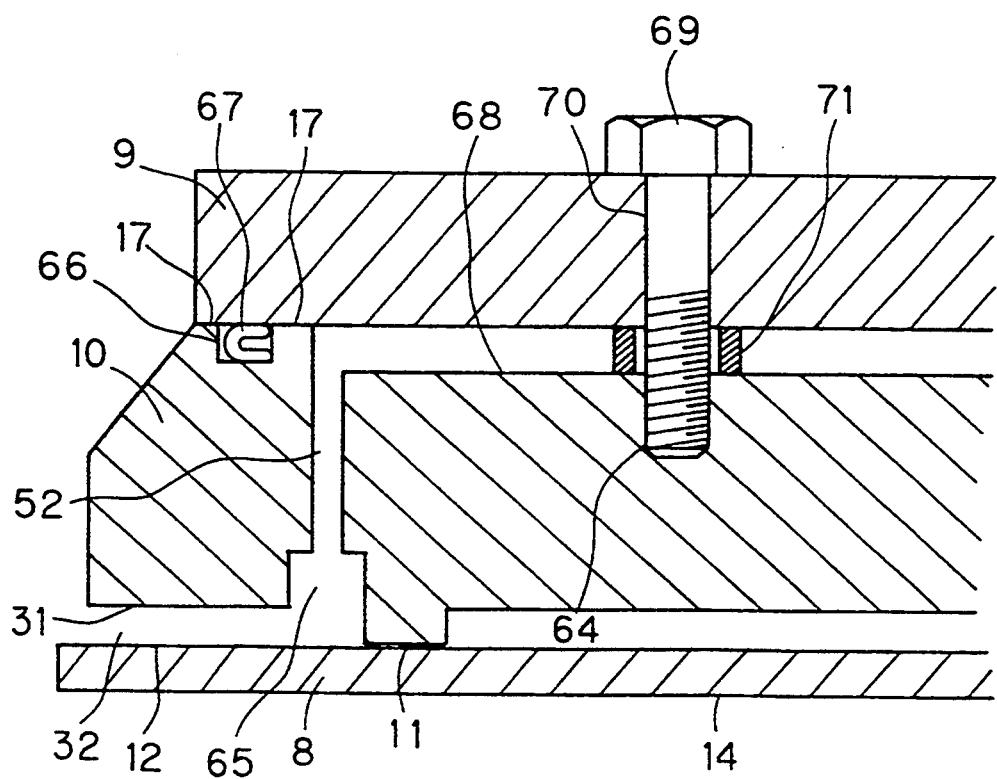
FIG. 11 is a sectional view illustrating a circumferential side wall of the stage and its vicinity.

FIG. 11 is an enlarged sectional view showing a circumferential side wall of a substrate holder 7 and its vicinity. A gap between the concave plane 68 and a bottom surface of a heater 9, which is formed when the heater 9 and the stage 10 are in contact with each other, conducts to a fluid duct 43 defined between an outer conduit 41 and an inner conduit 42 which is a passage for feeding inert gas supplied by an inert gas feeder 24. In order to prevent leakage of the inert gas into a reaction chamber 6 from holes 70 in which bolts 69 are fitted to tightly fix the heater 9 and the stage 10, an annular metal collar 71 is attached to each bolt 69. The inert gas, passing through inert gas feed holes 52 provided circularly in the concave plane 68 and further through a circular groove 65, is gushed into an inert gas jetting gap 32.

In this preferred embodiment, a passage of the inert gas between the bottom surface of the heater 9 and the upper surface of the stage 10 is not a groove as described in the previous preferred embodiments but a concave portion covering a specified region. Hence, there is the advantage that the passage for the inert gas can be more easily formed.

<5. The Fifth Preferred Embodiment>

Figure 12:
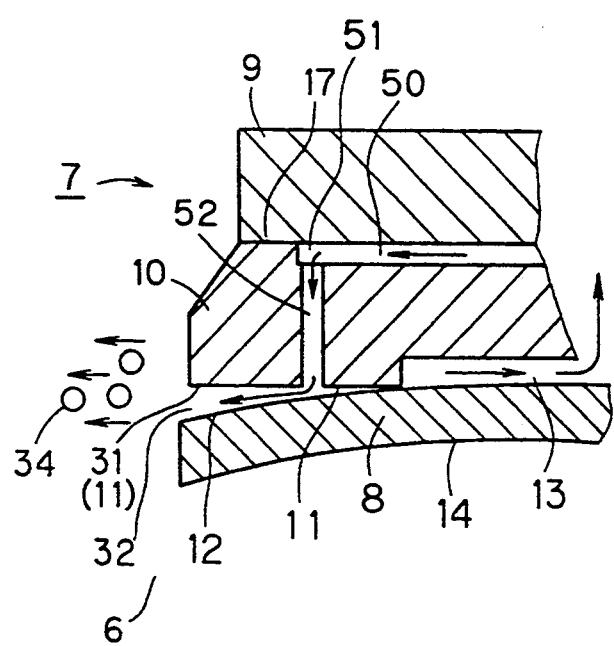
FIG. 12 is a sectional view illustrating a circumferential side wall of a stage and ills vicinity according to a fifth preferred embodiment of the present invention.

FIG. 12 is an enlarged sectional view showing a circumferential side wall of a substrate holder 7 and its vicinity of a manufacturing apparatus of a fifth preferred embodiment. In this preferred embodiment, there is no level difference in a bottom surface of a stage 10 outside a vacuum pocket 13. Specifically, an outermost circular surface 31 somewhat depressed from a substrate holding surface 11 is not provided outside the vacuum pocket 13. Thus, a semiconductor manufacturing apparatus of this preferred embodiment has the advantage that a configuration of the stage 10 is simpler than that of the first preferred embodiment. However, improved uniformity in the quantity of the inert gas jetted out along the entire circumference of the stage 10, which is attained by virtue of the level difference, cannot be obtained in this preferred embodiment.

<6. The Sixth Preferred Embodiment>

Figure 13:
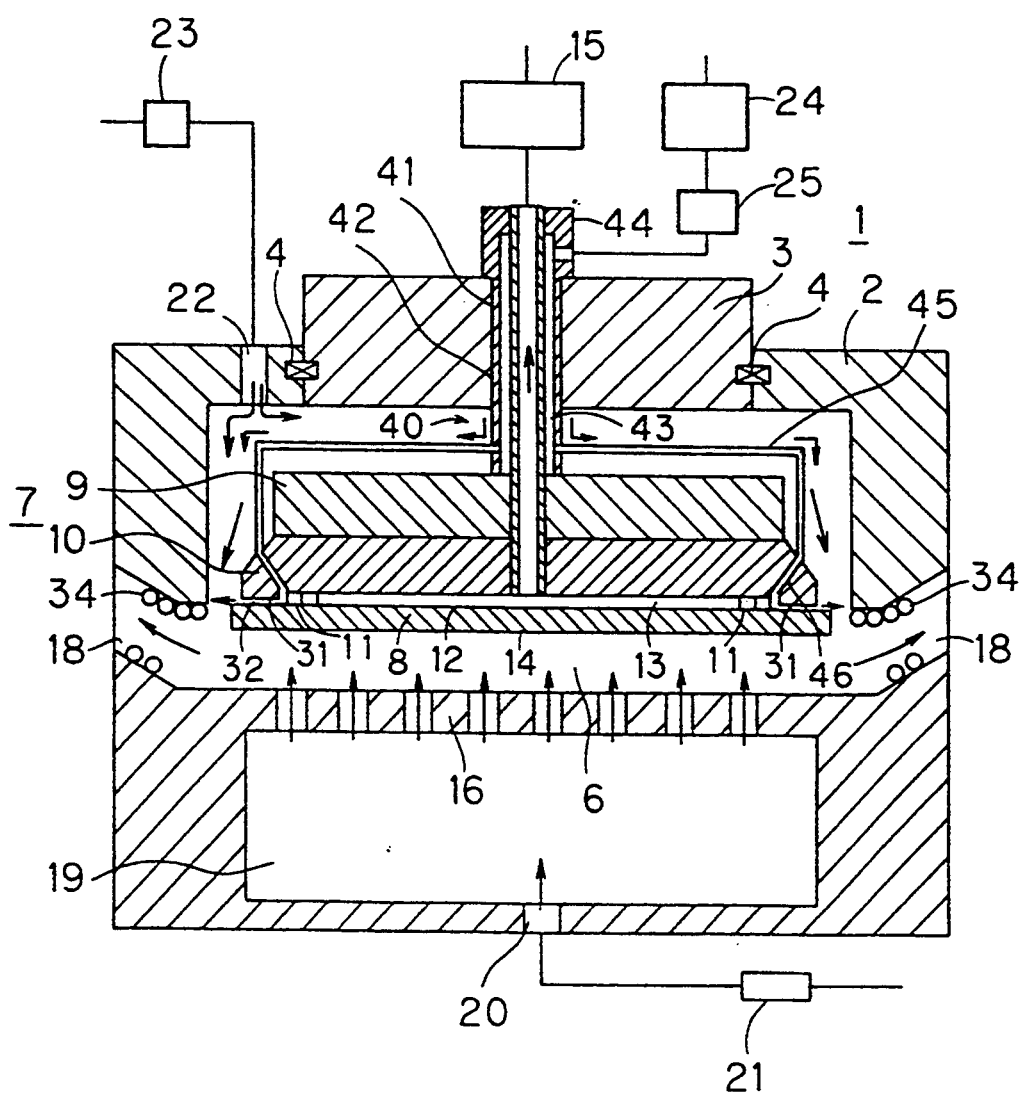
FIG. 13 is a front sectional view showing a semiconductor manufacturing apparatus of a fifth preferred embodiment of the present invention.

FIG. 13 is a front sectional view showing a semiconductor manufacturing apparatus of a sixth preferred embodiment. In this apparatus, inert gas fed to an inert gas jetting gap 32 goes through a passage provided outside a substrate holder 7. Similar to the apparatus of the first preferred embodiment, a lower end of an outer conduit 41 fixedly holds a heater 9. However, a fluid duct 43 constituting a feed passage for the inert gas does not reach an upper surface of the stage 10 but is terminated halfway. Instead, the fluid duct 43 leads to one end of an inert gas pipe 45 connected to a side wall of the outer conduit 41. The other end of the inert gas pipe 45 is connected to one end of an inert gas feed hole 46 extending through the stage 10 close to its circumferential side wall. The other end of the inert gas feed hole 46 reaches and opens to an outermost circular surface 31, and therefore, the inert gas fed from the inert gas pipe 45 through the inert gas feed hole 46 is gushed into an inert gas jetting gap 32.

The inert gas fed from an inert gas feeder 24 passes through a temperature controller 25 before getting to a bearing 44. The temperature controller 25 adjusts temperature of the inert gas. In the apparatus of this preferred embodiment, since the inert gas hardly pass through the inside of the substrate holder 7, the inert gas is not necessarily equal in temperature to the substrate holder 7. Hence, the temperature of the inert gas is adjusted in advance by the temperature controller 25 so that the temperature of the inert gas, when jetted out, is equivalent to the temperature of a semiconductor substrate 8.

In this preferred embodiment, there is the advantage that a configuration of the substrate holder 7 is simple and processing it is easy. This, for example, brings about a new advantage that the apparatus of this invention can be improved by adding new components such as the inert gas pipe 45 and the temperature controller 25 without applying lots of modification to the substrate holder 7 of the prior art apparatus where no inert gas is led. However, when the substrate holder 7 is to be newly made, for example, the apparatus of the first preferred embodiment which does not require any additional components such as the inert gas pipe 45, temperature controller 25, etc. is advantageous.

<7. The Seventh Preferred Embodiment>

Figure 14:
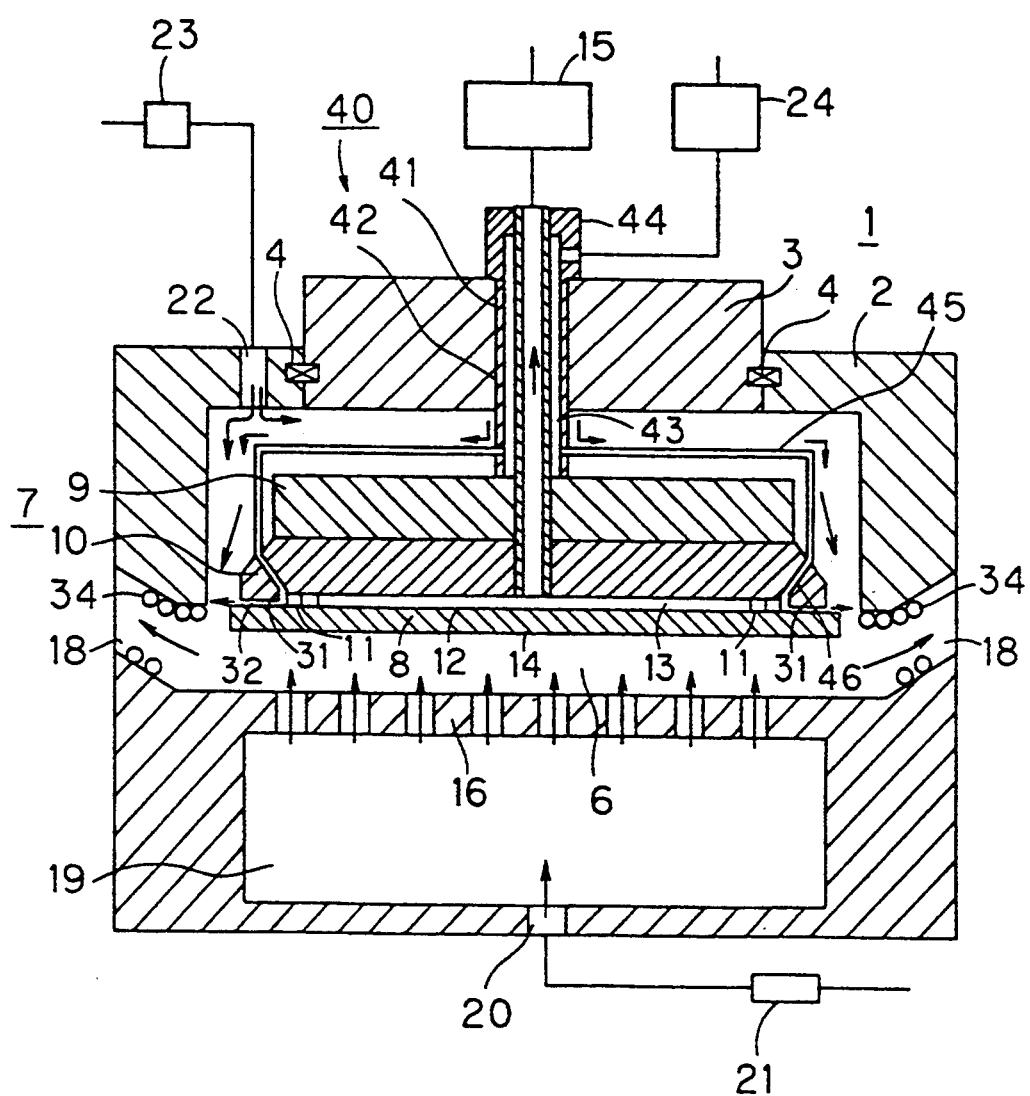
FIG. 14 is a front sectional view showing a semiconductor manufacturing apparatus of a seventh preferred embodiment of the present invention.

FIG. 14 is a front sectional view showing a semiconductor manufacturing apparatus of a seventh preferred embodiment. In the apparatus of this preferred embodiment, there is no temperature controller 25. Inert gas supplied from an inert gas feeder 24 is fed to a fluid duct 43 without temperature adjustment, and hence, the apparatus of this preferred embodiment can effect an object of the present invention to prevent penetration of reaction byproduct 34 in a bottom surface of a stage 10 by using a simpler arrangement than that of the apparatus of the sixth preferred embodiment. This apparatus is fully effective in use where precise uniformity in temperature of a semiconductor substrate 8 is not required.

<8. The Eighth Preferred Embodiment>

Figure 15:
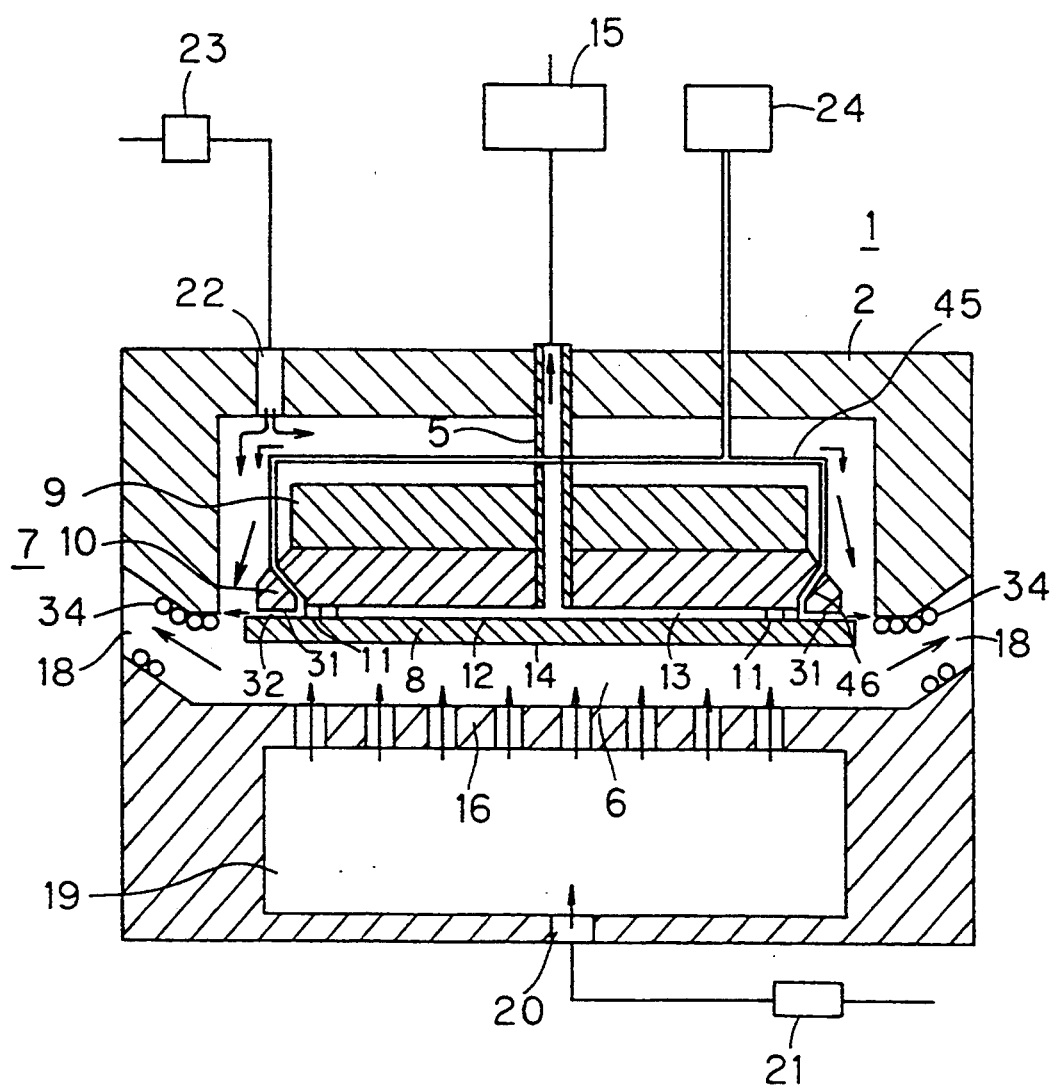
FIG. 15 is a front sectional view showing a semiconductor manufacturing apparatus of an eighth preferred embodiment of the present invention.
Figure 16:
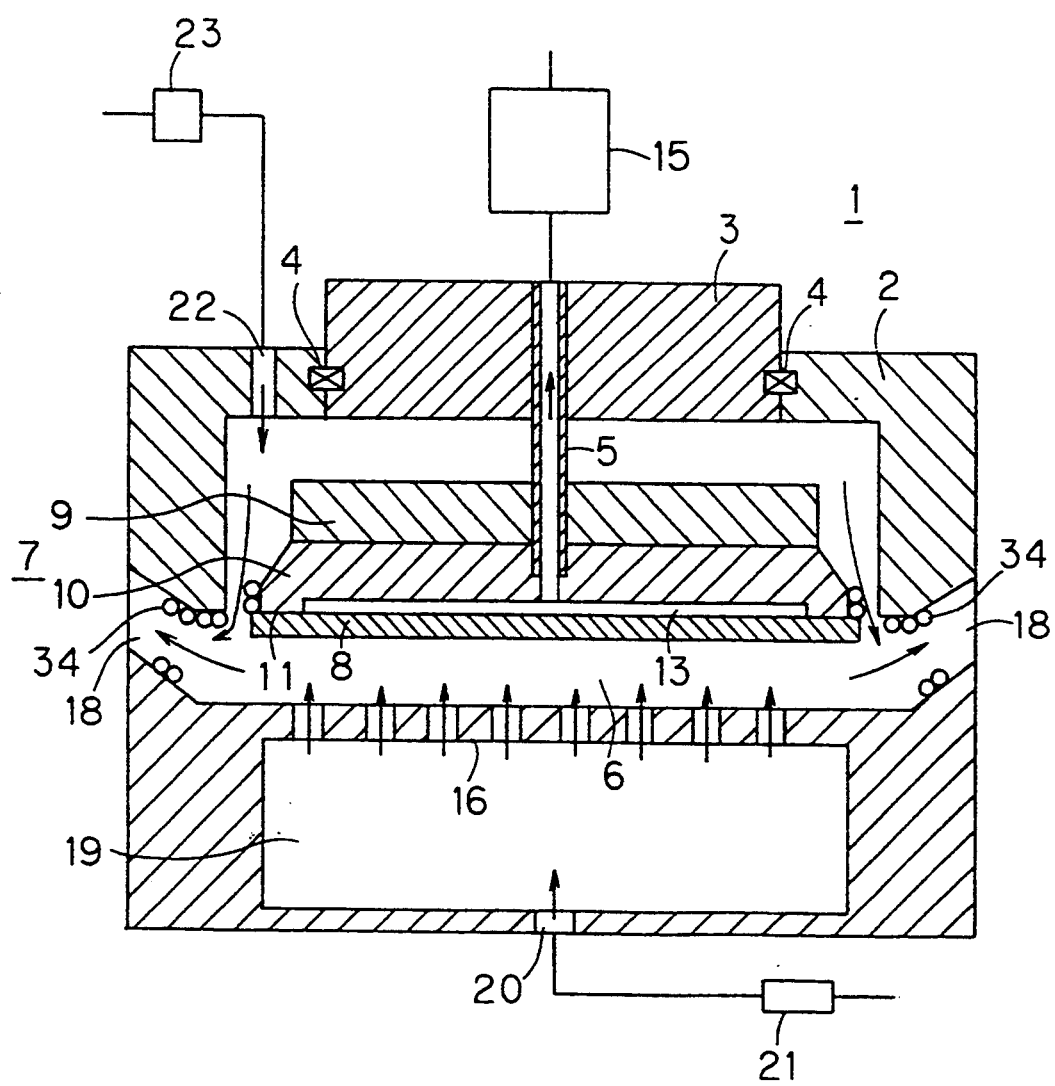
FIG. 16 is a front sectional view showing a prior art semiconductor manufacturing apparatus.
Figure 17:
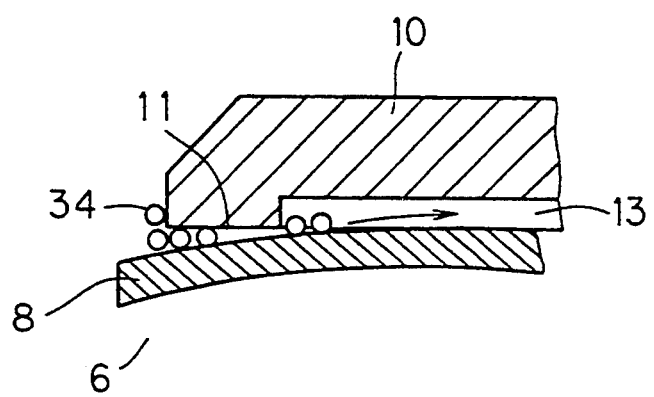
FIG. 17 is an enlarged sectional view illustrating a circumferential side wall of a stage and its vicinity in the prior art.

FIG. 15 is a front sectional view showing a semiconductor manufacturing apparatus of an eighth preferred embodiment. In the apparatus of this preferred embodiment, a substrate holder 7 is not rotated. Thus, a turn table 3 is needless to a reaction container 1. Since the substrate holder 7 does not rotate, an inert gas pipe 45 is directly connected to an inert gas feeder 24 without the dual conduit 40 and the bearing 44 as used in the previous preferred embodiments. The substrate holder 7 is hung from top of a reaction container body 2 by a vacuum conduit 5 alone. Although the apparatus of this preferred embodiment, similar to the apparatus of the seventh preferred embodiment, has an arrangement designed so as not to pass inert gas through the inside of the semiconductor holder 7, it may have an arrangement where the inert gas passes through the inside of the substrate holder 7 similar to the apparatuses of the first to sixth preferred embodiments.

Since the substrate holder 7 is not rotated, the apparatus of this preferred embodiment has the advantage that its arrangement is simpler than those of the first to seventh preferred embodiments. This preferred embodiment is fully effective in use where precise uniformity in film on a major treatment surface of a semiconductor substrate 8 by chemical reaction is not required.

<9. The Ninth Preferred Embodiment>

Inert gas supplied from the inert gas feeder 24 is fed so that it is jetted out along from the circumference at the bottom surface of the stage 10 toward the reaction chamber 6, in the above-mentioned preferred embodiment. As the greater quantity of the inert gas is fed, penetration of reaction byproduct 34 in the bottom surface of the stage 10 is more effectively prevented. However, if this is to an extent that the inert gas at least flows from the circumference at the bottom of the stage 10, there still is the effect of preventing penetration of the reaction byproduct 34. Thus, the quantity of the required inert gas may be of that which causes the inert gas to at least flow along from the circumference at the bottom of the stage 10.

<10. Application to Other Apparatuses>

As with the preferred embodiments above, a face-down type atmospheric pressure CVD apparatus has been described as an example. It is not intended that the present invention be restricted to this type of apparatuses. Even with a face-up type atmospheric CVD apparatus, for example, the invention can be made completely the same. Also with a pressure reduced CVD apparatus, the invention can be similarly made. Additionally, the invention is made with a PVD apparatus or in accordance with other substrate processing technologies.

Accordingly, in an aspect of the present invention, inert gas jets out of an inert gas jetting hole provided in a region surrounding a circumferential region of a pocket, and the jets of the inert gas effectively prevents penetration of undesirable objects between a major treatment surface and a substrate holding surface. In consequence, penetration of the undesirable objects into other components such as a pressure reducing means is also prevented. In this way, reduction of suction force for holding a semiconductor substrate is avoided, operating efficiency of the apparatus is enhanced, and the yield can also be enhanced.

In another aspect of the present invention, since inert gas flows into a gap between a surface of a substrate holding means partially depressed from a substrate holding surface and a major treatment surface of a semiconductor substrate, any part surrounding a pocket is filled with thoroughly uniform flow of the inert gas. In this way, penetration of undesirable objects between the major treatment surface and the substrate holding surface can be prevented more effectively.

In still another aspect of the present invention, since inert gas flows into a groove which is formed, surrounding a pocket, in a level difference or depression from a substrate holding surface, any part surrounding the pocket is filled with thoroughly uniform flow of the inert gas. In this way, penetration of undesirable objects between a major treatment surface and the substrate holding surface can be prevented more effectively.

In further another aspect of the present invention, since it is designed so as to keep a temperature difference small between inert gas and a semiconductor substrate in order to enhance uniformity in heat throughout the semiconductor substrate, quality of resultant products is improved, and the yield is further enhanced.

In yet another aspect of the present invention, since inert gas is assuredly heated by passing through a fluid passage between a heating means and a substrate holding means, quality of the resultant products is improved, and the yield is further enhanced.

In still yet another aspect of the present invention, since a passage between contact faces for feeding inert gas is defined by a concave portion formed in a certain area of at least one of the contact faces of a substrate holding means and heating means, the process of making the manufacturing apparatus is easy, and the passage for the inert gas can be provided in a simple way.

In further another aspect of the present invention, since a passage between contact faces for feeding inert gas is defined by a groove formed in at least one of the contact faces, the process of making the manufacturing apparatus is easy, and the passage for the inert gas can be provided in a simple way.

In yet another aspect of the present invention, since a seal means is provided surrounding a passage between contact faces for feeding inert gas, the inert gas passing through the passage is prevented from leaking in a reaction chamber.

In still yet another aspect of the present invention, since a circumferential side wall of a substrate holding surface is terminated somewhat inside a circumferential side wall of a semiconductor substrate, the whole substrate holding surface is covered with the semiconductor substrate and is never exposed. In this way, contamination of the substrate holding surface by undesirable objects such as reaction byproduct is prevented more effectively.

Also, in accordance with a semiconductor manufacturing method of the present invention, since inert gas jets out of inert gas jetting holes provided in a region surrounding a pocket, and the jets of the inert gas effectively prevents penetration of undesirable objects between a major treatment surface and a substrate holding surface. In consequence, penetration of the undesirable objects in other components such as the pocket and a pressure reducing means is also prevented. In this way, reduction of suction force for holding a semiconductor substrate is avoided, operating efficiency of the apparatus is enhanced, and the yield can also be enhanced.

Furthermore, since inert gas is heated before jetted from an inert gas jetting hole, a temperature difference between inert gas and a semiconductor substrate is kept small so as to enhance uniformity in heat throughout the semiconductor substrate. In this way, quality of treatment to the semiconductor substrate becomes excellent, and the yield is further enhanced.

Moreover, by heating a substrate holding means, inert gas which is passing through an inert gas feed passage provided in the substrate holding means is heated. Thus, since it is not needed separately heating a substrate treatment means and the inert gas, uniformity in heat throughout a semiconductor substrate is effectively enhanced even with a simple arrangement.

While the invention has been shown and described in detail, the foregoing description is in all aspects illustrative and not restrictive. It is therefore understood that numerous modifications and variations can be devised without departing from the scope of the invention.

We claim:

1. An apparatus for manufacturing semiconductor, in which a predetermined treatment is performed to a major treatment surface of a semiconductor substrate by feeding reactive gas, comprising:
   (a) a reaction container for defining therein a reaction chamber which is capable of containing said semiconductor substrate, and further defining a reactive gas inlet hole which opens toward said reaction chamber to feed said reactive gas into said reaction chamber, an evacuation hole which opens toward said reaction chamber to evacuate gas used for reaction from said reaction chamber;
   (b) substrate holding means fixed in said reaction container, for defining a substrate holding surface to hold said semiconductor substrate within said reaction chamber by getting in contact with a reverse major surface of said major treatment surface of said semiconductor substrate, a pocket surrounded by said substrate holding surface to hold said semiconductor substrate by suction force, and also defining an inert gas jetting hole in a region surrounding said pocket to jet inert gas out;
   (c) reactive gas feeding means conducting to said reactive gas inlet hole, for feeding said reactive gas to said reactive gas inlet hole;
   (d) pressure reducing means conducting to said pocket, for reducing pressure in said pocket;
   (e) inert gas feeding means conducting to said inert gas jetting hole, for feeding said inert gas to said inert gas jetting hole; and
   (f) heating means fixedly coupled to said substrate holding means, for heating said substrate holding means,
   wherein said substrate holding means and said heating means define respective contact faces and are in contact with each other on said contact faces, wherein said substrate holding means defines therein a first inert gas jetting passage for connecting said inert gas feeding means and said inert gas jetting hole, and wherein a second inert gas jetting passage conducting to said first inert gas jetting passage for connecting said inert gas feeding means and said inert gas jetting hole is provided between said contact faces.

2. The apparatus for manufacturing semiconductor of claim 1, wherein said inert gas jetting hole has a plurality of inert gas jetting holes.

3. The apparatus for manufacturing semiconductor of claim 2, wherein said reaction container includes:
   (a-1) a reaction container body; and
   (a-2) a turn table rotatably attached to said reaction container body, and
   said substrate holding means is fixedly coupled to said turn table so as to be rotatable together with said turn table in one united body.

4. The apparatus for manufacturing semiconductor of claim 3, wherein
   said substrate holding surface is perpendicular to a rotation axis of said turn table.

5. The apparatus for manufacturing semiconductor of claim 4, wherein said reaction container body includes (a-1-1) a reactive gas feed plate mounted facing said substrate holding surface, and said reactive gas inlet hole penetrates said reactive gas feed plate and opens toward said substrate holding surface.

6. The apparatus for manufacturing semiconductor of claim 1, wherein a different level surface is formed in a region surrounding said pocket of said substrate holding means, said different level surface defining a depression with respect to said substrate holding surface and excluding a portion of said substrate holding surface surrounding said pocket, and said inert gas jetting hole is provided in said different level surface.

7. The apparatus for manufacturing semiconductor of claim 6, wherein a groove surrounding said different pocket is formed in said level surface, and said inert gas jetting hole is provided in said groove.

8. The apparatus for manufacturing semiconductor of claim 1, wherein a circumferential side wall of said substrate holding surface is radially within inside a circumferential side wall of said semiconductor substrate.

9. The apparatus for manufacturing semiconductor of claim 8, wherein said reaction container includes:

(a-1) a reaction container body; and (a-2) a turn table rotatably attached to said reaction container body, and said substrate holding means is fixedly coupled to said turn table so as to be rotatable together with said turn table in one united body.

10. The apparatus for manufacturing semiconductor of claim 1 further comprises:

seal means provided in a region surrounding said second inert gas jetting passage to retain airtight condition in said second inert gas jetting passage.

11. The apparatus for manufacturing semiconductor of claim 1, wherein said reaction container includes:

(a-1) a reaction container body; and (a-2) a turn table rotatably attached to said reaction container body, said apparatus for manufacturing semiconductor further comprising:

(g) a first conduit provided along said rotation axis of said turn table, for connecting said turn table and said heating means fixedly; and (h) a second conduit inserted into said first conduit so that said first and second conduits are coaxial with each other and define a clearance therebetween, and one end of said second conduit is fixedly joined to said substrate holding means and conducts to said pocket, and the other end conducts to said pressure reducing means, and said second inert gas jetting passage and said inert gas feeding means are connected by the clearance between said first conduit and said second conduit.

12. The apparatus for manufacturing semiconductor of claim 1, wherein said second inert gas jetting passage is a concave portion formed in a predetermined region of at least one of said respective contact faces.

13. The apparatus for manufacturing semiconductor of claim 1, wherein said second inert gas jetting passage is a groove formed in at least one of said respective contact faces.

* * * * *